United States Patent
Crowley et al.

Patent Number: 5,666,112
Date of Patent: *Sep. 9, 1997

[54] KEY FOR FLEXIBLE KEYBOARD

[76] Inventors: Robert J. Crowley, 64 Puritan La., Sudbury, Mass. 01776; Donald N. Halgren, 35 Central St., Manchester, Mass. 01944

[*] Notice: The term of this patent shall not extend beyond the expiration date of Pat. No. 5,459,461.

[21] Appl. No.: 447,116

[22] Filed: Aug. 18, 1995

Related U.S. Application Data

[63] Continuation of Ser. No. 98,851, Jul. 29, 1993, Pat. No. 5,459,461.

[51] Int. Cl.$^6$ ........................ H03K 17/94
[52] U.S. Cl. ................ 341/22; 29/622; 400/491.1
[58] Field of Search ................. 341/20–22, 34; 345/168, 169; 364/708.1; 200/5 A, 512–517; 400/491.3, 491.1, 491; 29/622; 235/145 R

[56] References Cited

U.S. PATENT DOCUMENTS

| | | | |
|---|---|---|---|
| 3,964,594 | 6/1976 | Gabbrielli et al. | 400/472 |
| 4,017,848 | 4/1977 | Tannas, Jr. | 341/34 |
| 4,109,118 | 8/1978 | Kley | 200/5 E |
| 4,261,042 | 4/1981 | Ishiwatari et al. | 364/708.1 X |
| 4,517,421 | 5/1985 | Margolin | 200/5 A X |
| 4,795,888 | 1/1989 | MacFarlane | 235/145 R |
| 4,939,514 | 7/1990 | Miyazaki | 341/22 |
| 5,141,343 | 8/1992 | Roylance et al. | 400/472 |
| 5,142,109 | 8/1992 | O'Meara, Jr. | 200/5 A X |
| 5,163,765 | 11/1992 | Levy | 200/5 A X |
| 5,197,178 | 3/1993 | Lichte et al. | 29/428 |
| 5,212,473 | 5/1993 | Louis | 345/168 |
| 5,220,521 | 6/1993 | Kikinis | 364/708.1 X |
| 5,305,181 | 4/1994 | Schultz | 345/168 X |
| 5,311,656 | 5/1994 | Eldershaw | 29/622 |
| 5,459,461 | 10/1995 | Crowley et al. | 341/22 |

FOREIGN PATENT DOCUMENTS

| | | | |
|---|---|---|---|
| 201259 | 11/1986 | European Pat. Off. | 400/481 |

OTHER PUBLICATIONS

Cook et al., "Key Matrix Using a Fluid Medium", IBM Tech. Discl. Bull., vol. 13, No. 3, Aug. 1970.

*Primary Examiner*—Thomas Mullen
*Attorney, Agent, or Firm*—Don Halgren

[57] ABSTRACT

The present invention includes a flexible, pressurizable keyboard made of resilient layers of plastic material, with molded keys which are deformable when pressed so as to send a signal to an electrical device. The keys are arranged with a flexible electrical circuit thereattached, which when depressed, establish a proper complete circuit.

7 Claims, 6 Drawing Sheets

KEY FOR FLEXIBLE KEYBOARD

This is a Continuation application of our U.S. patent application Ser. No. 08/098,851 filed Jul. 29, 1993, now U.S. Pat. No. 5,459,461.

BACKGROUND OF THE INVENTION (1) Field of the Invention

This invention relates to the field of keyboards for computers, calculators, telephones and electronic devices where data entry is necessary.

(2) Prior Art

Miniaturization of electronic devices such as calculators, computers, telephones, amusement devices and like electronic equipment has advanced rapidly over the past few years. Data entry devices have become miniaturized as well. The term "chicklet keys" has been used to identify very small tabs utilized on some small devices for data entry into that device. While these keypads are somewhat flexible, the problem with that type of terminal is that the operator has a difficult time in hitting the proper key to efficiently do the job. The data entry operator's hands/fingers are relatively large, and these keys lack the full stroke, size and tactile contact feedback of full sized keyboards that are preferred. Current laptop and palmtop devices suffer from the problem of short stroke and compacted, dense key layouts.

It is thus an object of the present invention to provide a data entry panel which will accommodate the needs of the electronic device, will accommodate the physical reality of the data entry operator, and permit the data entry equipment to be functionally full sized and functionally similar feel to conventional keyboards familiar to most keyboard operators, yet be miniaturizable to accommodate the need for reduced components.

It is a further object of the present invention to provide a data entry panel which will provide the operator with a proper tactile response to pressure on the appropriate keys on that data entry panel and thus provide the same benefits preferred in "hard" keyboards.

It is yet a further object of the present invention to provide a relatively thin, low mass, data entry panel which can be distorted from its functional shape to permit storage in a small compartment/manner in the data processing unit, yet be deployable at will, inexpensive and reliable.

BRIEF SUMMARY OF THE INVENTION

The present invention comprises a data entry panel or keyboard which is full size to permit normal data entry of present day configuration while permitting the keyboard to also be reduced in size when not in use.

The keyboard comprises a plurality of layers of flexible material, typically joined at least at their periphery, to provide an inflatable pad, of standard keyboard quality and size and with standard keyboard function features. The pad/keyboard may be inflated for use with a pressurized air or fluid, or may be filled with a compressible foam for certain uses, the pressure in the keyboard being regulatable to the user's taste, is waterproof, floatable, has few parts, and is safe for children.

The upper layer may be comprised of a molded keypad having formed keys, the molding/forming operation effecting the thickness of the layer to facilitate distortion of the keys when pressed. The upper layer may be clear material, and an array of solar cells may be disposed thereunder, so as to provide electrical energy to the system from the keyboard itself.

The bottom side of the upper layer around each formed key, has a conductive trace which is connected to a circuit portion which is in communication with an electrical device, computer or the like.

The bottom layer is comprised of a flexible resilient sheet of plastic material having corresponding conductive traces in juxtaposition with the conductive traces defining the periphery of the keys on the bottom side of the upper layer of flexible material.

The corresponding conductive traces are connected to the circuit which is in communication with the electrical device, computer or the like. The circuit passes through the peripheral wall of the keyboard, and may have an inflation lumen arranged therewith, to provide means for directing pressurized fluid to the space between the upper and lower layers thereof. The upper and lower layers of material are molded, bonded or heat sealed at their common peripheries and at several spots between keys, to prevent shifting of one layer relative to the other layer, adversely effecting the electrical contacts between the conductive traces.

In an alternative embodiment, the conductive traces could be comprised of piezoelectric strips disposed across the inner surface of the upper layer of material, which piezoelectric material creates an electric signal when compressed which is the case when a particular key is depressed. The piezoelectric material is preferably polyvinylidene fluoride, which when it is part of the circuit in conjunction with the keys, permits electrical signals to be established at and by the keys themselves, and is itself flexible. The piezoelectric material as the ability, when both the upper and lower electrical circuits are configured, to generate voltages in response to vibrations in a manner similar to a microphone, and also to generate acoustical sounds like a loudspeaker, when a voltage is applied across it. Thus the keyboard arrangement may serve the dual purpose of providing both data entry and audio reception and transmission.

The manufacture of the upper layer may be accomplished by vacuum molding a layer of plastic material over a keypad mold. The material will stretch and reduce its thickness in certain peripheral areas around each key, which permits that key, when depressed, to flex at that thinner periphery. The flexure of that material provides a tactile response to the keyboard operator. By virtue of the plastic material's ability to buckle in a predetermined manner, and thus to yield at or near a full keystroke, effectively duplicates the tactile characteristic of conventional keyboards. The pressure within the keyboard forces those keys to return to their erect state after they have been hit and depressed. As they are depressed, the conductive trace in or around the key periphery comes into contact with the proper corresponding conductive trace on the lower layer, thus completing the circuit to send a desired signal to the electrical device, computer, telephone, etc.

BRIEF DESCRIPTION OF THE DRAWINGS

The objects and advantages of the present invention will become more apparent when viewed in conjunction with the following drawings, in which.

DESCRIPTION OF THE PREFERRED EMBODIMENTS

Figure 1:
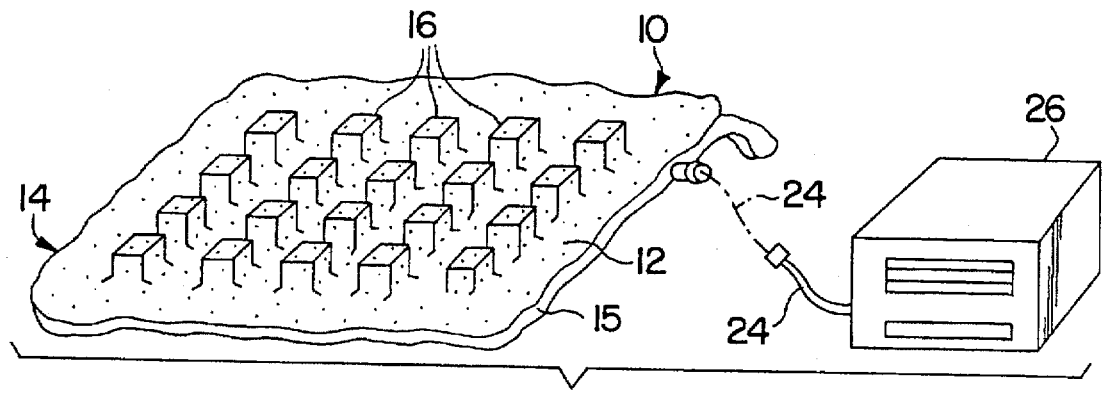
FIG. 1 is a perspective view of an inflatable keyboard arranged in communication with an electronic device.

Referring now to the drawings in detail, and particularly to FIG. 1, there is shown a data entry panel or inflatable keyboard 10. The keyboard 10 is comprised of an upper layer 12 and a lower layer 14 of flexible polymeric material such as Mylar material, vinyl, urethane, PE, polypropylene or rubber, as shown also in FIG. 3.

The upper and lower flexible layers 12 and 14 are joined as by welding, at a common periphery 15, to form an inflatable envelope which comprises the keyboard 10. The upper layer 12 has a plurality of appropriately located key pads 16 extending upwardly therefrom.

Figure 2:
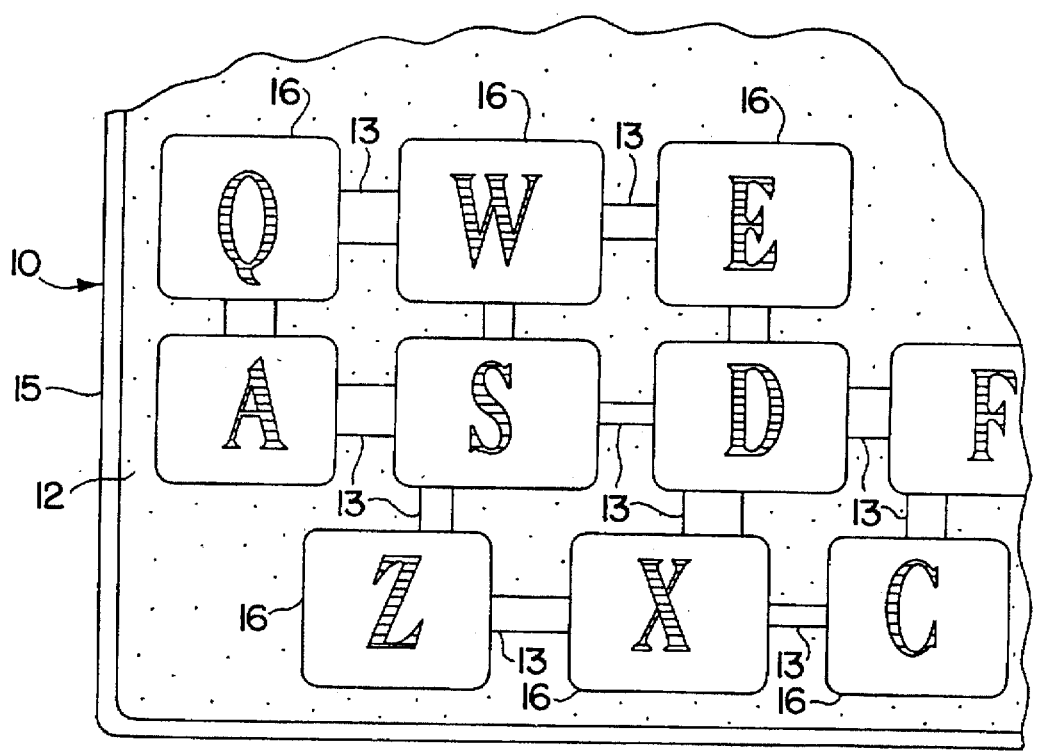
FIG. 2 is a plan view of part an inflatable of keyboard.

A plan view of the upper layer 14 is shown in FIG. 2, showing the key pads 16 having interconnected inflation channels 13 disposed therebetween.

Figure 4:
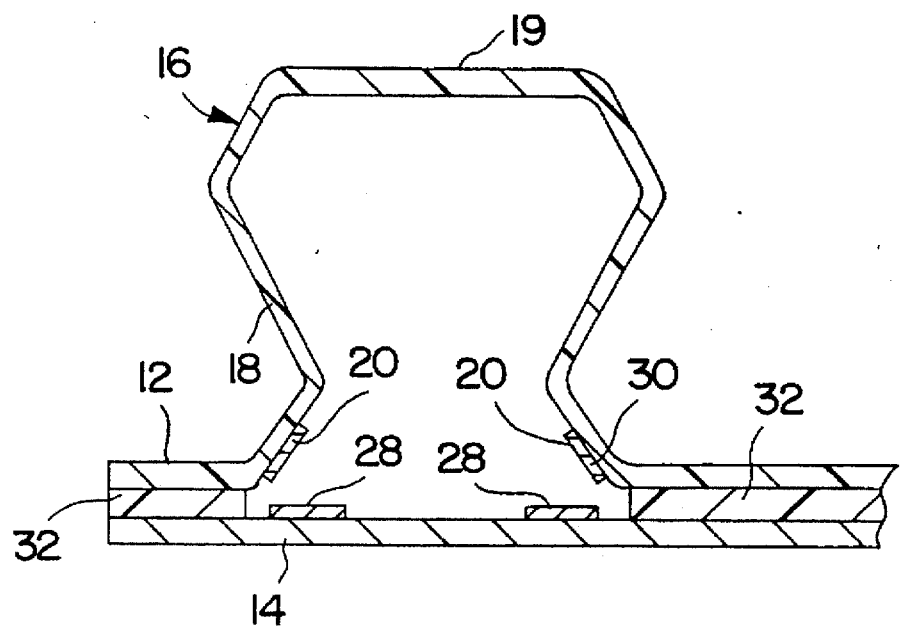
FIG. 4 is a cross-sectional view of a key on an inflatable keyboard assembly in its standby mode.
Figure 4A:
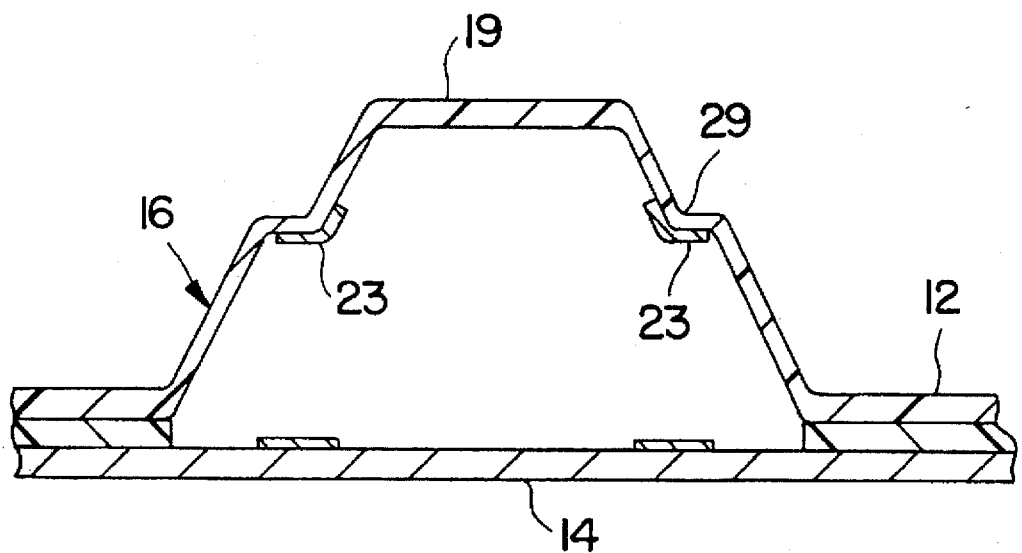
FIG. 4a is a cross-sectional view of an alternative embodiment of the embodiment shown in FIG. 4.

The upper layer 12 has the keypads 16 formed so as to permit their flexure and compressibility relative to the lower layer 14. The keys 16 may be formed on a vacuum mold, not shown, which causes portions of that upper layer 12 comprising that key 16 to stretch more than other portions of the key 16, such as circumferential wall sections 18, as shown in FIG. 4. The circumferential wall sections 18 are therefore thinner, thus making that section more flexible permitting it to be depressed, as shown in FIG. 5 and 5a, yet retaining a relatively stiff and hard keytop 19 that enhances tactility and maintains stability of its electrical system.

Figure 5:
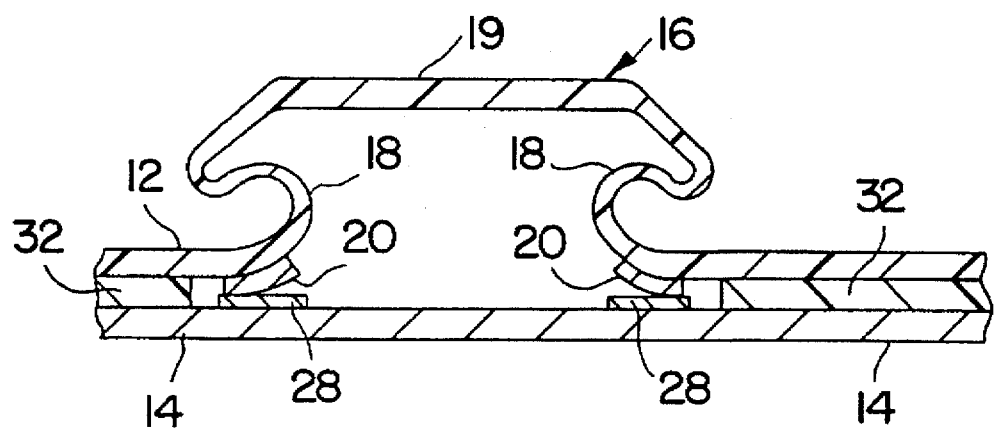
FIG. 5 is a cross-sectional view of a key on an inflatable keyboard assembly in its depressed "contact" mode.
Figure 5A:
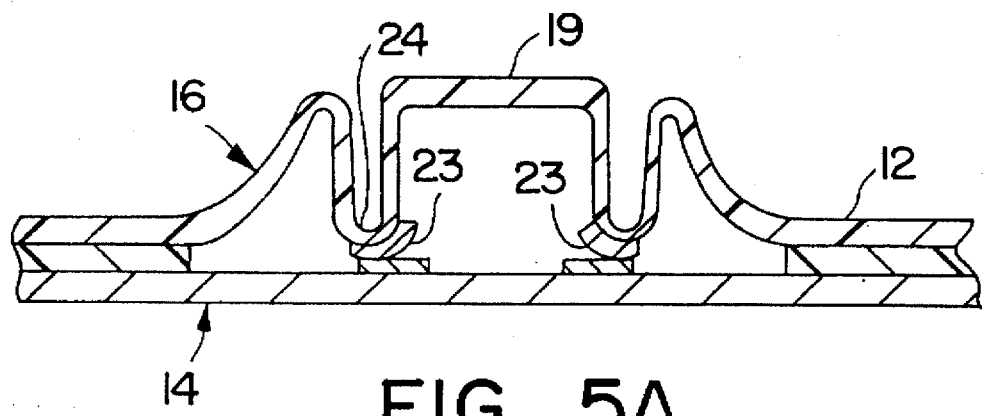
FIG. 5a is an alternative embodiment of the device shown in FIG. 5.

Each key 16 may have an upper conductive trace 20 around at least a portion of the inner side of each flexible wall section 18, as shown in FIGS. 4 and 5. Each upper conductive trace 20 is connected to and completes an electrical circuit 22 arranged on the bottomside of the upper layer 12, and which is in electrical communication with a conduit 24 to a controlled electronic device 26 into which the keyboard 10 feeds as shown in FIG. 1.

The bottom or lower layer 14 has a lower conductive trace 28 in conductive juxtaposition with its respective upper conductive trace 20 for each key 16 on the keyboard 10. Each lower conductive trace 28 is connected to and is part of an electrical circuit 30 arranged on the topside of the lower layer 14, as shown in FIG. 4. The embodiments shown in FIGS. 4b and 5a show a conductive trace 23 on an annular rim 29 of a key 16 on the upper layer 12 of flexible material. That rim 29 is that portion of the upper layer 14 of the key 16 which actually does the most bending or flexing, going from an "L" shape in cross-section, to a "U" shape as may be seen in the figures.

A thin layer of insulative material 32, may be disposed between the upper and lower layers 12 and 14, as shown in FIGS. 4 and 5. The insulative material 32 may be arranged so as to have gaps thereacross, defining the inflation channels 13 between adjacent keys 16, as shown in FIG. 2, while allowing bonding between the upper and lower layers 12 and 14, while preventing short circuits therebetween.

The electrical circuits 22 and 30 feed through a plug 25 and the conduit 24 and into the device 26, which itself may be a computer system, monitor, telephone switchboard, radio, cellular telephone or the like. The plug 25 and conduit 24 shown more explicitly in FIGS. 8 and 9, may also include an inflation lumen 36 in addition to a pair of electrical conduits 38 and 40 adapted to mate with the electrical circuits 22 and 30 of the keyboard 10. Each conduit 38 and 40 may also comprise contacts on plug 25, as shown in FIG. 10, which may mate with contacts 22 and 30 in receiving socket 41, shown in FIG. 9a, in the keyboard 10, while sealing like a plug or a stopper. The socket 41 has the upper circuit 22 and the lower circuit 30, as shown in FIG. 9a which mates with the plug 25 to provide proper fluid pressure and electrical communication between the conduit 24 and the keyboard 10.

Figure 11:
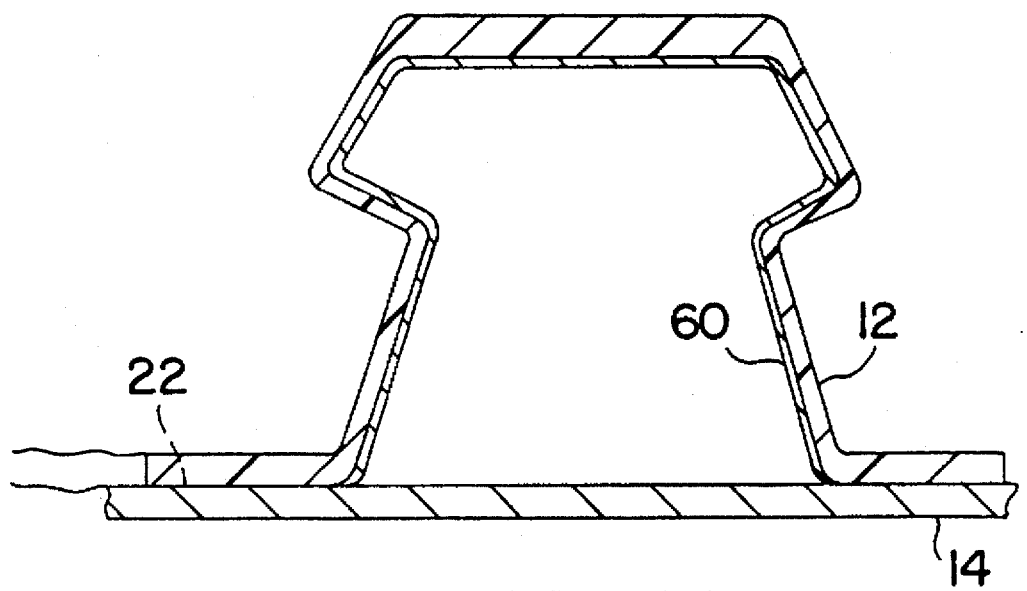
FIG. 11 is a cross-sectional view of a laminated keytop with a piezoelectric inner liner.
Figure 12:
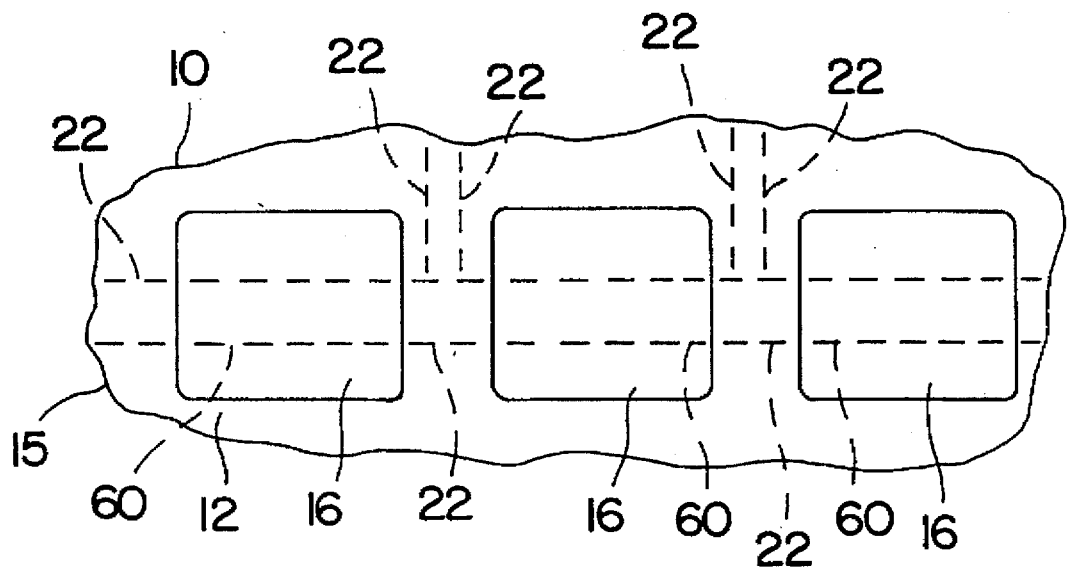
FIG. 12 is a partial plan view of a laminated keytop keypad showing a strip of polyvinylidene fluoride extending under a row of keytops.

The embodiment shown in FIGS. 11 and 12 utilizes a strip, patch or annular arrangement of piezoelectric material 60 in each key 16 on the inner side of the upper layer 12 of flexible material. The piezoelectric material 60, made from polyvinylidene fluoride or the like, when arranged in secure contact with the flexible material of the upper layer 12, itself flexes, thereby generating an electrical signal from that particular key 16 which has been depressed, thus sending the signal through the conductive traces, to the monitor or equipment being controlled by the keyboard. The polyvinylidene fluoride can also be used as a loudspeaker or a microphone, as previously discussed.

Figure 3:
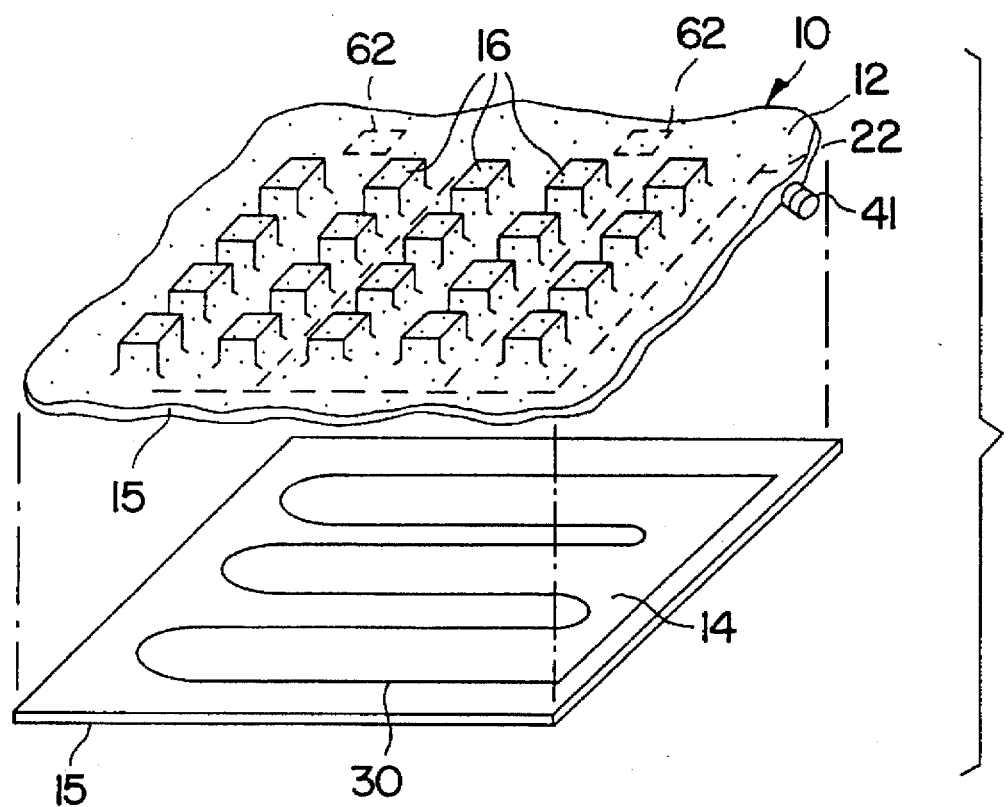
FIG. 3 is an exploded view of an inflatable keyboard assembly.
Figure 8:
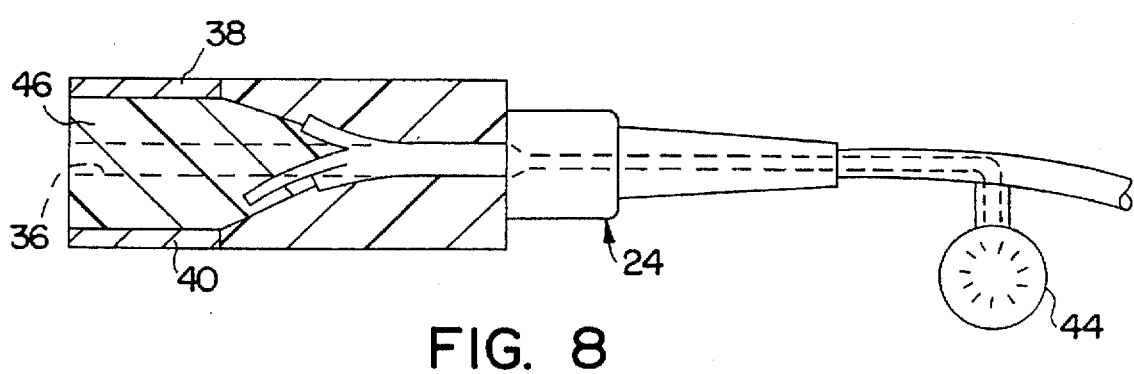
FIG. 8 is a side elevational view, partially in section, of a combination inflation conduit (signal conduit)
Figure 9:
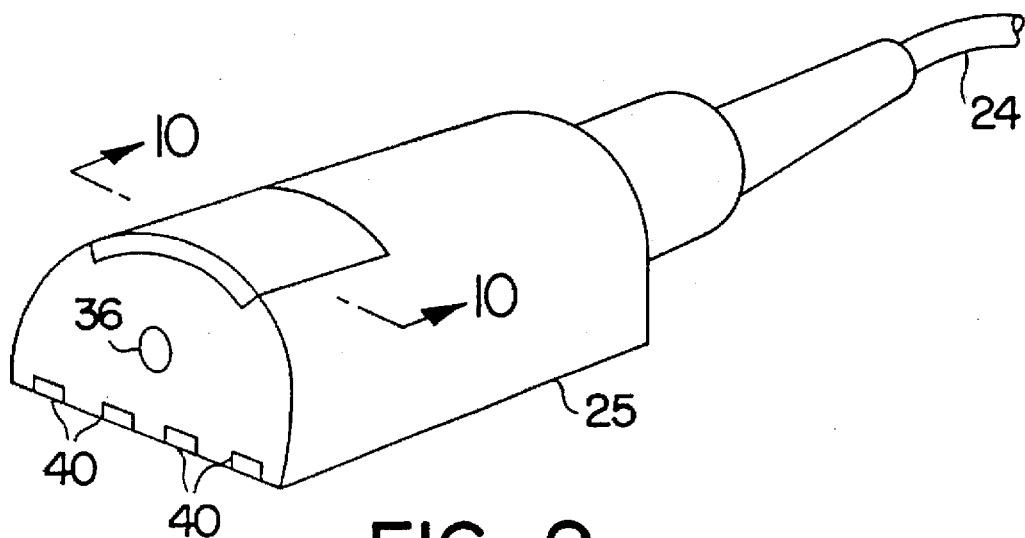
FIG. 9 is a perspective view of a plug and inflation conduit (signal conduit) for an inflatable keyboard.
Figure 9A:
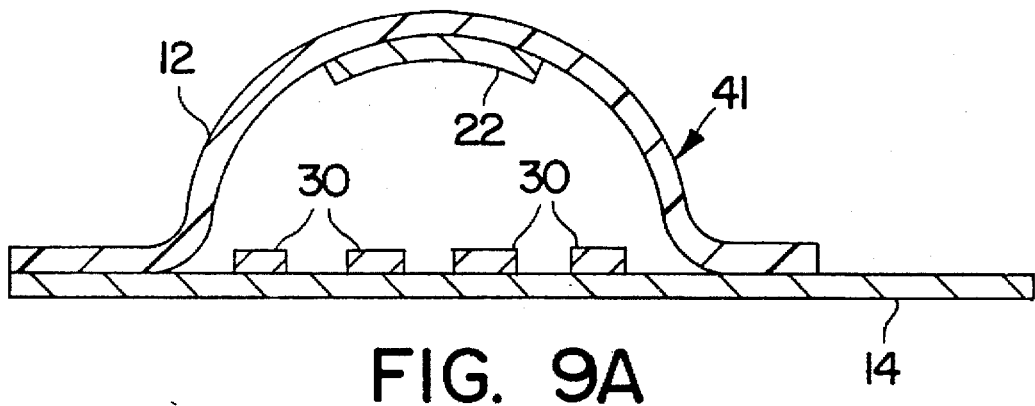
FIG. 9a is a cross-sectional view of a connector socket configuration on the inflatable keyboard.
Figure 10:
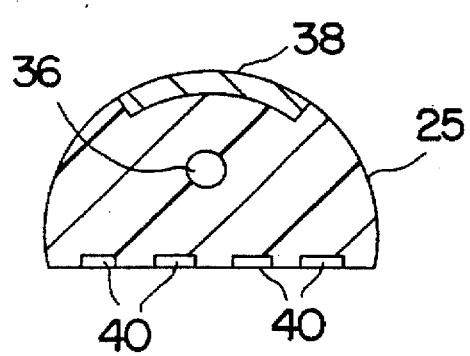
FIG. 10 is cross-sectional view taken along the lines x—x of FIG. 9.

An electrical air pump 44 may be in fluid communication with the inflation lumen 36 as shown in FIGS. 8 and 9 to provide ongoing fluid/air pressure, as needed to maintain a constant pressure within the keyboard 10 itself, or the pump 44 may be powered by solar cells 62 disposed beneath the upper layer 12 of flexible material as shown in FIG. 3, when such upper material is transparent. The solar cells 62 would be connected through proper circuitry, not shown, similar to the traces aforementioned, and may be attached via the connector 25 to the electrical device 26. A valve 46 such as a duckbill type valve, may be disposed within the receiving socket or in the distal end of the plug 25 as shown in FIG. 8, to keep air from escaping the keyboard 10 until it is desired to unplug the unit or disassemble it, however, the required volume of air is small, and oral fillup is also suitable. The pressure of air (or foam) within the keyboard 10 may be regulated or controlled by the pump and valve 46 to permit adjustment of tactile response, or to adjust hardness of the keyboard 10 to the taste of the user.

Figure 6:
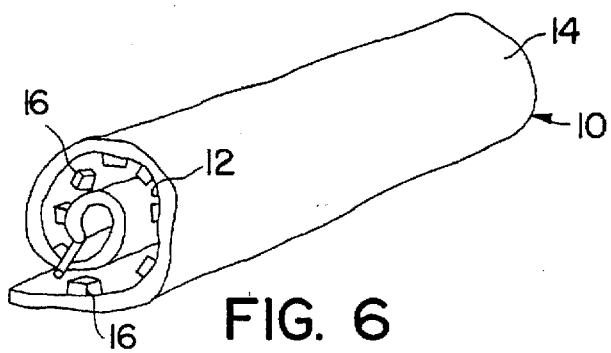
FIG. 6 is a perspective view of an embodiment of storage of an inflatable keyboard.

In manufacture of the keyboard 10, the upper layer 12 may be made from a vacuum molding process whereby a sheet of flexible heat moldable plastic is drawn over a keypad mold. The material stretches and thins in certain areas, as aforementioned, to provide the desired flexibility therewith. After the conductive traces/circuitry which may be applied by masked vacuum metalization or the application by printing of suitable conductive inks such as silver bearing inks are attached to their respective sides of the upper and lower layers 12 and 14 of the flexible material together with the insulation, their common peripheries 15 are heat sealed or welded, thus defining an inflatable pad which is capable of being rolled-up or folded along crease lines 47, after deflation, as respectively shown in FIGS. 6 and 7.

The keyboard 10 without pressurized fluid (or foam) therewithin thus permits it to be maintained/stored in a minimum volume, ready to be expanded and utilized in a manner similar to a full size keyboard, the flexure of the keys 16 providing a tactile feedback as the material snaps or flexes from its erect to its depressed configuration.

Figure 7:
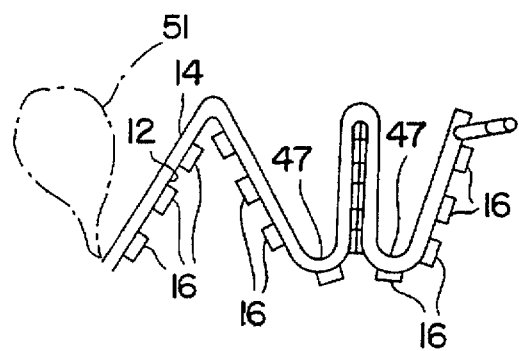
FIG. 7 is an end view of a further embodiment of storing an inflatable keyboard; .

In a further embodiment with a pressurized medium, FIG. 7 shows in side view in phantom a wrist rest 51 comprised of an elongated, inflatable pillow-like bag which may be in fluid communication with the pressurized keyboard to permit a user to rest his/her wrists thereon when inputting data into the keyboard 10. The rest bag 51 is hingedly attached to the proximal edge of the keyboard 10 to prevent injury to the user of the device.

We claim:

1. A key arranged to permit the entering of data into a data entry panel, said key comprising:

a molded layer of flexible material formed to be distorted to provide a full keystroke when pressed;

a reduced wall thickness of said flexible material comprising the periphery of said key, to permit said distortion thereat;

said key having an upper keytop portion which is stiffer and relatively hard with respect to said walls thereof; and said key having a trace of conductive material disposed on said reduced thickness wall from which to create a signal in said data entry panel.

2. The key arranged to permit the entering of data as recited in claim 1, wherein said data entry panel has a first layer of flexible material which comprises said molded layer of said key.

3. The key arranged to permit the entering of data as recited in claim 2, wherein said data entry panel has a second layer of flexible material beneath said first layer of flexible material and being joined at their peripheries to form an inflatable chamber therebetween.

4. The key arranged to permit the entering of data as recited in claim 3, wherein said second layer of material has a corresponding conductive trace thereon which is arranged to contact said conductive trace on said first layer of flexible material, completing a circuit when said contact is made during distortion of said key.

5. The key arranged to permit the entering of data as recited in claim 3, wherein said conductive trace of material on said first layer, is comprised of a piezoelectric material.

6. The key arranged to permit the entering of data as recited in claim 1 wherein said reduced thickness wall permits a tactile response when said key is depressed.

7. A key arranged to permit the entering of data into a data entry panel, said key comprising:

a molded layer of flexible material formed to be distorted to provide a full keystroke when pressed;

a wall of reduced material stiffness which wall comprises the periphery of said key, to permit distortion of said reduced stiffness wall; said distorted wall of reduced material stiffness arranged to permit a tactile response when said key is depressed by the bending of the material thereat; and said wall having a conductive trace material thereon, said conductive trace of material arranged to complete an electrical circuit when said key is distorted, for the entry of data through said panel to a further electrical device.

* * * * *